(12) United States Patent
Gahan et al.

(10) Patent No.: US 12,399,474 B2
(45) Date of Patent: Aug. 26, 2025

(54) CONTROLLER FOR A MATCHING UNIT OF A PLASMA PROCESSING SYSTEM

(71) Applicant: Impedans Ltd, Northern Cross (IE)

(72) Inventors: David Gahan, Terenure (IE); Jj Lennon, Ballymun (IE); Ian Olivieri, Chiavari Genoa (IT); Paul Scullin, Lucan (IE); Peter Daly, Naas (IE)

(73) Assignee: IMPEDANS LTD, Dublin (IE)

( * ) Notice: Subject to any disclaimer, the term of this patent is extended or adjusted under 35 U.S.C. 154(b) by 573 days.

(21) Appl. No.: 17/750,766

(22) Filed: May 23, 2022

(65) Prior Publication Data

US 2022/0404785 A1    Dec. 22, 2022

(30) Foreign Application Priority Data

Jun. 17, 2021   (IE) .................................... S2021/0123
Oct. 22, 2021   (EP) .................................... 21204160

(51) Int. Cl.
    *G05B 19/042*    (2006.01)

(52) U.S. Cl.
    CPC .... *G05B 19/042* (2013.01); *G05B 2219/2639* (2013.01)

(58) Field of Classification Search
    CPC .......... H01J 37/32183; H01J 37/32174; G05B 19/042; G05B 2219/2639
    USPC ....................................................... 700/295
    See application file for complete search history.

(56) References Cited

U.S. PATENT DOCUMENTS

| 9,831,071 B2 * | 11/2017 | Howald ............ H01J 37/32183 |
| 9,865,432 B1 | 1/2018 | Bhutta |
| 10,269,540 B1 * | 4/2019 | Carter ................ H01J 37/32183 |
| 2006/0220574 A1 * | 10/2006 | Ogawa .............. H01J 37/32183 |
| | | 315/111.21 |
| 2007/0262723 A1 * | 11/2007 | Ikenouchi ................ H05H 1/46 |
| | | 315/111.21 |
| 2009/0000942 A1 * | 1/2009 | Bai .................... H01J 37/32082 |
| | | 204/298.03 |

(Continued)

FOREIGN PATENT DOCUMENTS

| CN | 1444257 A | * | 9/2023 | ........... C23C 16/505 |
| CN | 112585716 B | * | 4/2024 | ........ H01J 37/32146 |

(Continued)

OTHER PUBLICATIONS

Extended European Search Report, EP Application No. 22173193.8, dated Oct. 7, 2022, pp. 8.

(Continued)

*Primary Examiner* — Ronald D Hartman, Jr.
(74) *Attorney, Agent, or Firm* — J. Fish Law, PLLC

(57) ABSTRACT

A matching unit controller working in combination with a matching unit for a plasma processing machine is described. In one example, the controller has a master controller application and acts as a local master in the matching unit. In one example, the controller gathers data from the input and output sensors and feeds the data to an intelligent algorithm. In one example, the output from the algorithm is used to set the matching unit capacitor positions. In one example, the controller also has a slave controller application to communicate with a master controller of the plasma processing machine.

15 Claims, 2 Drawing Sheets

(56) References Cited

U.S. PATENT DOCUMENTS

| | | | | |
|---|---|---|---|---|
| 2015/0200079 A1* | 7/2015 | Bhutta | ..................... | H03H 7/40 |
| | | | | 438/10 |
| 2018/0053633 A1* | 2/2018 | Glazek | ................ | H01J 37/3299 |
| 2021/0090859 A1 | 3/2021 | Bhutta | | |
| 2023/0245874 A1* | 8/2023 | Marakhtanov | .... | H01J 37/32935 |
| | | | | 315/111.21 |
| 2024/0094273 A1* | 3/2024 | Guo | ................. | H01J 37/32917 |
| 2024/0177970 A1* | 5/2024 | Bhutta | ................ | H01J 37/3299 |

FOREIGN PATENT DOCUMENTS

| | | | | |
|---|---|---|---|---|
| EP | 3091559 A1 | | 11/2016 | |
| EP | 4227978 A1 * | | 8/2023 | ........ H01J 37/32091 |
| WO | 2012094416 A1 | | 7/2012 | |

OTHER PUBLICATIONS

Search Opinion and Report, EP Application No. 21204160.2, dated May 25, 2022, pp. 8.

* cited by examiner

CONTROLLER FOR A MATCHING UNIT OF A PLASMA PROCESSING SYSTEM

CROSS-REFERENCE TO RELATED APPLICATIONS

This application claims priority to Intellectual Property Office of Ireland Patent Application No. S2021/0123, file Jun. 17, 2021 and European Patent Application No. EP221204160, filed Oct. 22, 2021, the entire contents of each are incorporated herein by reference.

TECHNICAL FIELD

The present invention generally relates to the control system for RF matching networks (units) used in plasma processing machinery and other RF power delivery applications.

BACKGROUND

Plasma processing is used extensively in the manufacture of semiconductor devices, solar cells, flat panel displays and certain medical devices, to name but a few applications. One of the most common methods for energizing a plasma process is to deliver electrical power at RF (radio-frequencies) into a processing chamber containing the process gas mixture. Some of the parent gas atoms or molecules are ionized, thus creating a sufficient population of free electrons and ions to form a plasma (also known as the fourth state of matter). The plasma state creates highly reactive ion species which rain down on any workpiece introduced to the plasma chamber. These bombarding ion species modify the workpiece surface to create pre-defined structures, features or surface properties.

In a typical RF plasma process, RF power is coupled to the gas mixture in the chamber through an electrode or an antenna to excite the plasma state. Radio frequency power is most commonly delivered at 13.56 MHz, but frequencies from 10's of kilohertz to 100's megahertz are also commonly seen. The RF generator delivers power to the process chamber through a transmission line. The transmission line characteristic impedance is matched to the generator output impedance, typically 50 Ohms, to optimise power coupling. Ideally, the chamber impedance should also be 50 Ohms to avoid an impedance mismatch and cause power to be reflected back to the generator. Unfortunately, it is unlikely that a plasma chamber will have 50 Ohm characteristic impedance at all frequencies and plasma conditions. Therefore, an intermediary circuit is used to match the impedance of the RF generator, the transmission line and the plasma chamber. This intermediary circuit with adjustable impedance is commonly known as an RF impedance matching network.

The RF matching network transforms the RF impedance of the plasma chamber to 50 Ohms to maximize power delivery from the generator. In other words, the combination of the matching network (circuit) and plasma chamber is 50 Ohms when measured at the plane where the transmission line is connected. A typical RF matching network includes an input power sensor, variable capacitors, inductors and a controller circuit on which an auto-tune matching algorithm can be programmed in a microprocessor or microcontroller. The matching network (circuit) topography and the values/size of the variable capacitors/inductors that make up the RF matching network are determined by the power delivery requirements, frequency of operation, and impedance range of the plasma processing chamber.

The types of input sensor commonly used in RF matching network applications are directional couplers and phase/mag detectors. VI (voltage and current) probes or sensors are less common. The directional coupler measures the forward and reflected power at the match input. The phase/mag detector monitors the magnitude and phase of the impedance of the matching network plus chamber. The data from the input sensor is fed to the controller where an algorithm is used to tune the variable capacitor values so as to minimize the reflected RF power, in the case of the directional coupler, or bring the magnitude and phase of the impedance to 50 Ohms and zero degrees respectively, in the case of the phase/mag detector. This works well for simpler, continuous RF processes. For more complex semiconductor fabrication processes, where the RF power is pulsed and where the radio-frequency is dynamic, more advanced sensors such as the VI probe, located at both the input side and output side of the matching network are required. Advanced VI probes monitor the magnitude of the RF voltage and current (and their harmonics) and the phase shift between them. Thus, they can accurately measure complex impedance at both the 50 Ohm (input side) and the non 50 Ohm (output side) of the match during pulsing and in the presence of dynamic frequency tuning.

The advantage of having an accurate output sensor in the matching network is that the chamber impedance can be measured directly. This provides an additional data point to enable faster impedance matching. It can reduce the reliance on preset capacitor positions, where the capacitors need to be in the vicinity of the match point so as not to get "lost" during tuning. The controller used in the typical matching network runs the control algorithm. The control algorithms are proprietary to the matching network manufacturer and not configurable by the user. This can limit the adaptability of the matching network to new processes which is one of the key requirements of a smart manufacturing process (explained in more detail below). Thus, a smart matching network controller used in combination with accurate input and output VI probes is highly desirable.

As nanotechnology devices shrink in size and/or become more complex, the processes used to manufacture them too have become more complex. In particular, there has been a democratization of semiconductor integrated circuit design, with many of the technology giants preferring to design their own devices to meet their own very specific needs. There has been no such democratization of semiconductor manufacturing, however, due to the enormous cost and complexity involved. This is forcing semiconductor device manufacturers to make production lines smarter to cope with a wider variety of semiconductor devices to be manufactured. Smart sensors, such as the input and output VI probes in the matching network, are key to smarter, more adaptable manufacturing processes.

Smart manufacturing is often defined as highly adaptable computer-integrated manufacturing where rapid modifications to the manufacturing process are enabled. Smart manufacturing relies on smart sensors that automatically collect and analyse data and smart controllers to make intelligent decisions to optimize the performance of production machinery based on the smart sensor data. The data from sensors and machines are often communicated to the Cloud or factory network using industrial IoT (Internet of Things) connectivity solutions deployed at the factory level. Industrial IoT technology enables the flow of data through the factory and provides the capability to monitor and manage processes remotely, thus allowing production schedules to be altered quickly and in real-time as necessary.

One important consideration for the smart factory is the amount of data produced by the smart sensors and machinery. Edge analytics is a term used to describe data collection and analytical computation performed on or near a smart sensor instead of waiting for the data to be sent back to a centralized database. Running the data through an analytics algorithm at source, at the edge of a factory network, allows companies to set parameters around what information is worth storing in a database for later use and what data can be discarded. Analysing data as it is generated can also decrease latency in the decision-making process. For example, if the input and output sensor data from the matching network are analysed by a local controller, rules built into the analytics algorithm to interpret the data at the network edge can automatically tune the variable capacitors to the optimum position. A reduced dataset can then be sent to the centralised location for storage. Algorithmic rules can be modified rapidly over the factory network, which has a slower speed requirement than the actual data processing speed.

A crucial aspect of the smart factory implementation is the speed, reliability and suitability of the network connection. Factory automation control systems are by definition "real-time systems". Controlling machines often requires very low latency. Messages passed on the network should have a priority attached to them e.g. an emergency stop message should not get delayed by a large data back-up stream. The real-time messages should get priority. In conventional Ethernet networks there is no protocol for prioritization with all data treated equally. Albeit inexpensive and fast, Ethernet is not easy to adapt for interconnecting control systems. The problem lies mostly in the determinism or time accuracy needed for real time control.

Accordingly, there is a need for a controller for a matching unit which addresses the drawbacks of the prior art.

SUMMARY OF THE INVENTION

The present teachings relate to a controller for a matching unit of a plasma processing system, the controller configured to receive impedance data with respect to an RF generator of the system (as measured from the RF generator side of the system) from the matching unit, receive impedance data with respect to a chamber of the system from the matching unit, process the impedance data using an algorithm to determine a target impedance of the matching unit to match the impedance of the chamber to the impedance of the generator, adjust the capacitances of variable capacitors of the matching unit to achieve the target impedance, wherein the controller is further configured to simultaneously act as a master controller for the matching unit when communicating with matching unit, and act as an slave controller for the matching unit when communicating with a master controller of the plasma processing system.

The controller may be further configured to communicate with the matching and plasma processing system across a network based on at least one network protocol.

Optionally, wherein the receiving and processing of the impedance data and adjusting the capacitances are performed for each step of a multiple step plasma process and the controller is configured to receive an algorithm during each step of the plasma process and use the received algorithm for a subsequent step of the plasma process.

Optionally, the controller is further configured to receive an algorithm via the network while performing any of the receiving and processing the impedance data and adjusting the capacitances, and store the received algorithm for later use.

The controller may be further configured to receive an algorithm, while acting as the slave controller of the matching unit, from a master controller of the plasma processing system, and while simultaneously acting as the master controller for the matching unit.

The controller may be further configured to store a high resolution map of an impedance matching range, wherein the map is used to find the target impedance based on the impedance data from the output sensor.

The controller may be further configured to process the impedance data with respect to the chamber of the system, use the algorithm to find conjugate impedance on the high resolution map and adjust the capacitances of the variable capacitors to achieve the conjugate impedance.

The controller may be further configured to apply a fine tuning step after the capacitors have been adjusted to achieve the conjugate impedance, the fine tuning step further adjusting the capacitances of the capacitors to maximise power delivery.

The impedance data with respect to an RF generator of the system may be received from an input sensor of the matching unit.

Optionally, the input sensor monitors the magnitude of the RF voltage and current, their harmonics and the phase shift between them.

The impedance data with respect to a chamber of the system may be received from an output sensor of the matching unit.

Optionally, the input and output sensors monitor the magnitude of the RF voltage and current, their harmonics and the phase shift between them.

The controller may be further configured to interface with a computer via a communication port distinct from an interface used to communicate with the plasma processing system.

Optionally, the controller is further configured to receive an algorithm via the interface, store the received algorithm and use the algorithm to determine the target impedance.

The present teachings are also directed to a matching unit comprising the controller of outlined above.

BRIEF DESCRIPTION OF THE DRAWINGS

The invention will be further illustrated by the following description of embodiments thereof, given by way of example only with reference to the accompanying drawings, in which.

DETAILED DESCRIPTION

Figure 1:
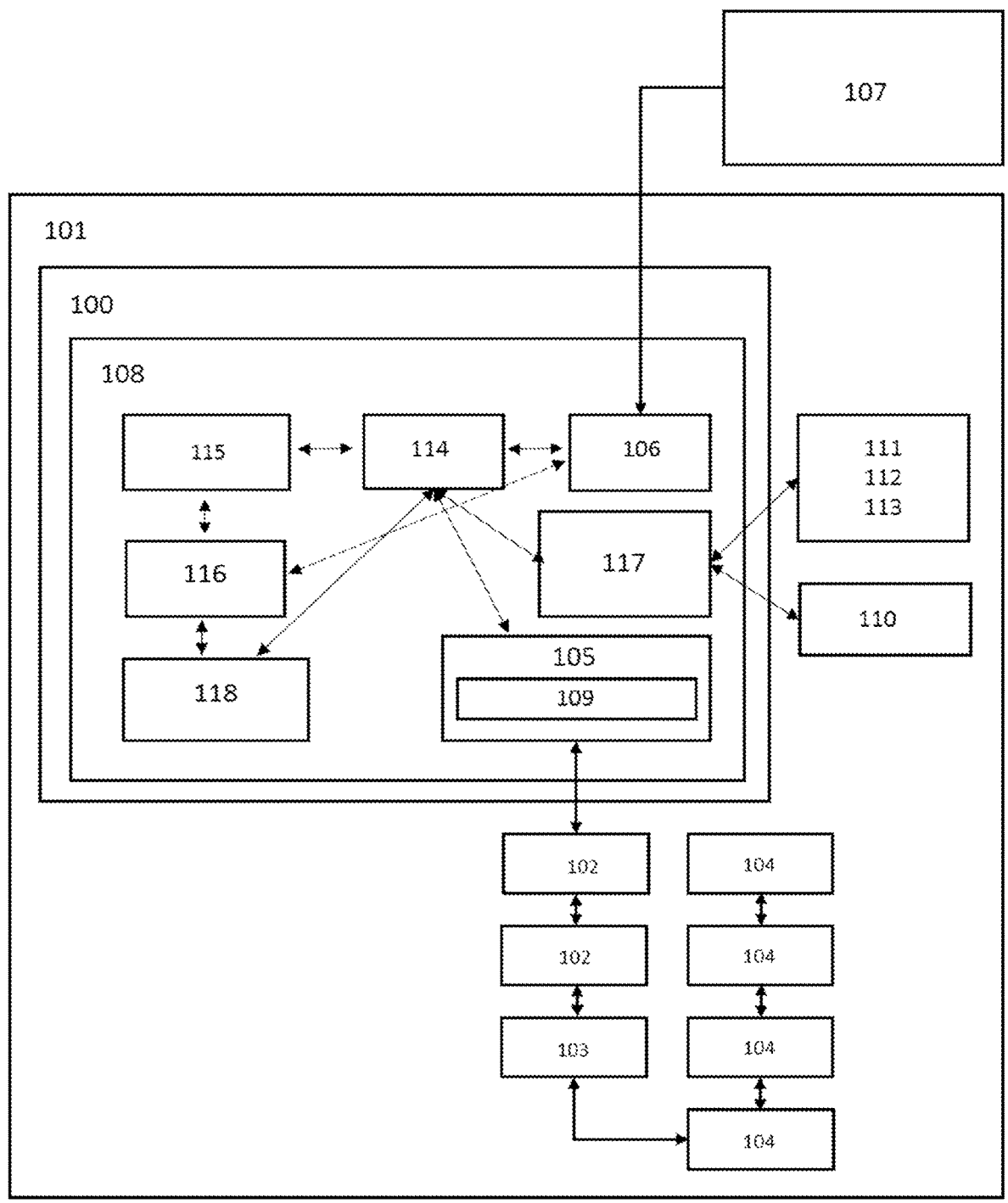
FIG. 1 shows a controller for a matching unit (network) of a plasma processing machine in accordance with the present teachings.

There is provided by this invention a controller 100 for controlling a radio-frequency matching network (unit) 101, referred to as a match-controller henceforth. In one embodiment the match-controller is installed within the matching network housing.

The match-controller 100 in accordance with the present teachings relies on the use of a standardised communication protocol. EtherCAT has been found suitable. This protocol was developed by Beckhoff Automation; a major manufacturer of PLCs (Programmable Logic Controllers) used in industrial automation and real-time control systems. EtherCAT is a real-time Industrial Ethernet technology. The EtherCAT protocol is suitable for real-time applications in industrial automation. Two focal points during the development of EtherCAT were short cycle times (or latency) of ≤100 μs and low jitter for accurate synchronization of ≤1 μs. The semiconductor industry has adopted EtherCat as an automation standard and EtherCat device profiles and standards are now available for semiconductor industry specific devices, including RF generators and matching networks.

An EtherCAT "master" sends a message that passes through each device or node on the EtherCat network. Each EtherCAT "slave" device on the network reads the data addressed to it and inserts its data in the message frame. The last node detects an open port and sends the message back to the EtherCat master using the full duplex capability. The EtherCAT master is the only node allowed to actively send an EtherCAT frame. All other nodes (slaves) merely forward frames downstream, thereby preventing unpredictable delays to ensure real-time capabilities. This provides a complication for an EtherCat based matching-controller 100. If the input sensor 102, output sensor 103 and variable capacitors 104 all use EtherCat protocol then the local match-network controller 100 should act as an EtherCat master device for these sensors and capacitors. However, the plasma processing machine (of which the matching network is a part) is likely to have an EtherCat master controller to control all EtherCat devices on the machine including the match unit 101. Due to the EtherCat architecture, there cannot be two masters.

The match-controller 100 in accordance with the present teachings acts as an EtherCat master device 105 when reading data from the RF sensors 102, 103 and using said data to control the variable capacitors 104 or interlock switches. The match-controller 100 acts as an EtherCat slave device 106 for communication with the plasma processing machine's EtherCat master controller 107. For many reasons it is better to have the match-controller 100 localised in/near the matching network 101 rather than controlling the matching network 101 functionality from afar e.g. from the factory network.

This localisation of the match-controller 100, in EtherCat master mode 105, within the matching network housing allows it to run at speeds independent of the factory network. This can achieve lower latency when working at the edge of the factory network close to where the sensor data is generated. Intelligent algorithms can be deployed to the match-controller CPU 108 and changed on the fly, over EtherCat, or through other protocols provided. Data from the sensors 102, 103 are passed through the intelligent analytics algorithms to rapidly make decisions about the plasma impedance and change the capacitor 104 positions accordingly, to optimise the matching performance. The match controller 100 can receive an algorithm during a step of a plasmas process while reading data from the RF sensors 102, 103 and using the data to control the variable capacitors. The received algorithm can be used in a subsequent step of the same plasma process or in a different plasma process. Receiving and processing of impedance data and adjusting capacitances happens continuously on a millisecond time scale. Tuning is therefore a continuous process, within each process step. The new algorithm can be sent/received anytime and used within the existing step or for the subsequent, or any later step. This control system is scalable to handle multiple sensors and devices such as capacitors and interlock switches as necessary.

Figure 2:
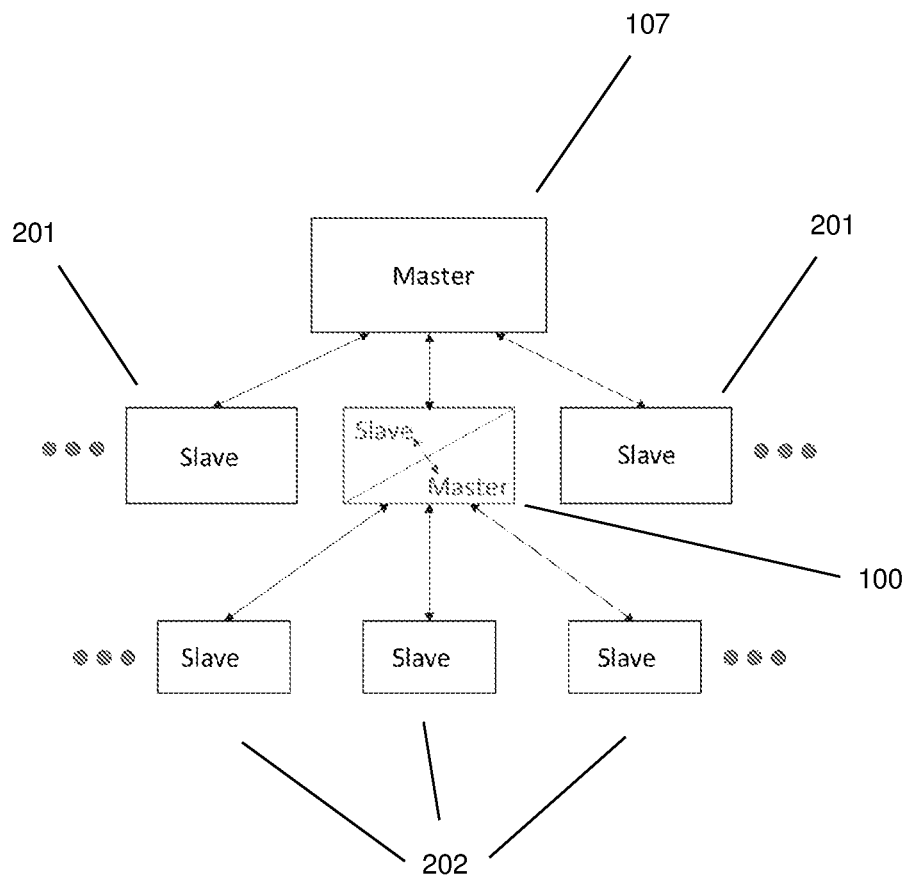
FIG. 2 shows the controller of FIG. 1 exhibiting simultaneous master and slave capabilities.

FIG. 2 illustrates the match controller 100 exhibiting simultaneous master and slave capabilities to enable a multi-level control architecture. As previously described, the plasma processing machine has a master controller to control all (slave) devices 201 on the machine including the match unit 101. The slave devices 202 could be the previously referenced RF sensors 102, 103, variable capacitors 104 or other slave devices of the matching unit 101.

A key feature of this invention is the end user's ability to access and change the algorithms on the controller 100. While using a first algorithm for first step of a plasma process step, the match controller 100 can receive a second algorithm and use this for a second (or later) step of the plasma process. Existing matching networks do not have this capability, with only the matching network vendor's engineering team capable of changing matching algorithms. This is an important feature for plasma process development where rapid prototyping and testing of novel RF matching schemes and algorithms can significantly reduce process development time for plasma process equipment manufacturers.

In one embodiment the RF impedance matching network (unit) is a dual frequency matching network with the configurable, auto-tuning, match-controller integrated. The plasma machine (or tool) host computer communicates to the match-controller via the EtherCat network. It should be noted that this match-controller is not limited to EtherCat connectivity and it is clear to the person skilled in that art that with minor changes any of a number of other protocol can be used. Some suitable alternative protocols are outlined in the table below. It should also be appreciated that a mix of protocols could be used as motors (for the capacitors 104) require very little data whereas the sensors will require high bandwidth. Regardless of which protocol is chosen, the controller 100 can be treated as a slave device 106 to the plasma tool master controller 107.

| Protocol | Medium | Electrical Noise Immunity | Speed | Connection | Integration |
|---|---|---|---|---|---|
| EtherCat | Ethernet 100 T | Good | High | Daisy Chain/ Fieldbus | Easy/follows standard |
| EtherNet/IP | Ethernet 100 T | Good | High | Bus (requires network router) | Easy/follows standard |
| ModBus/TCP | Ethernet 100 T | Good | High/Medium | Bus (requires network router) | Easy/follows standard |

-continued

| Protocol | Medium | Electrical Noise Immunity | Speed | Connection | Integration |
|---|---|---|---|---|---|
| TCP socket | Ethernet 100 T | Good | Potentially High | Bus (requires network router) | Each device will have proprietary protocols |
| Web service | Ethernet 100 T | Good | Medium/Low | Bus (requires network router) | Easy/follows standard |
| SPI | 3/4 wire | Low | High/Medium | Point to Point (can be Multiplexed) | Each device will have proprietary protocols |
| RS232 | 3 wire | Medium | Medium | Point to Point | Each device will have proprietary protocols |
| RS485 | 5 wire | Good | Medium | Point to Point or Daisy chain | Each device will have proprietary protocols |
| CAN | 5 wire | Good | Low | Daisy chain | Easy/follows standard |
| ModBus | 5 wire | Good | Low | Daisy chain | Easy/follows standard |
| DeviceNet | 5 wire | Good | Low | Daisy chain | Easy/follows standard |

Dual-frequency matching networks are commonly used in the industry where two radio-frequencies (from two independent RF sources) are fed into two matching networks before being combined at the output into a single line. For this topology, the controller has access to two input sensors 102 (to measure the impedance at each frequency at the input) and one output sensor 103 to measure the combined dual-frequency output impedance. The matching network may have four, or more, motorised tuning capacitors 104 which also communicate directly with the match-controller. In one configuration, the match-controller 100 is an EtherCat master device 105 which communicates with the input 102 and output 103 sensors (VI sensors) to read RF data, including the RF impedance, at each driving frequency and uses said RF data to calculate the optimum capacitor 104 positions. The capacitor 104 positions are moved accordingly using a motor interface protocol 109.

FIG. 1 illustrates an embodiment of the RF Match controller design in accordance with the present teachings. In this exemplary embodiment the match-controller 100 sits within the walls of the matching network (unit) 101 housing. It could also sit near the matching network and not inside the housing. Other hardware devices located inside the matching network 101 include RF input sensors 102, RF output sensors 103, motorised capacitors 104, status LEDs 110, dc bias (Vdc) sensors 111, temperature sensors 112 and interlock switches 113. The RF match-controller housing encases the computer or microcomputer 108 and its interfacing connectors.

In the preferred embodiment, the information hub is a Redis database 114, which is a shared memory variable storage that can be accessed by all applications. Redis (Remote Dictionary Server) is an in-memory data structure store and supports different kinds of abstract data structures, such as strings, lists, maps, sets, etc. It is open-source software suitable for this application. However, there are many alternatives that can be used.

The EtherCat Slave Application 106 includes the EtherCat Software Stack which provides the application side of the EtherCat protocol. It services the EtherCat Slave Controller (ESC) updating its memory state and responding to CAN over EtherCat (CoE) and File over EtherCat (FoE) and other EtherCat service requests. The slave application 106 will translate the information stored in Redis to a format suitable for EtherCat and will update Redis using any new settings passed from the plasma tool EtherCat Master 107.

The EtherCat Master Application 105 controls the local EtherCat network. It will initialise the RF sensors 102, 103 and update Redis 114 with sensor readings and the current motor positions (settings of the variable capacitors). Any change in target motor positions calculated will trigger a change in the motor destination via the motor interface protocol 109.

A match auto-tune application 115 will read the sensor and motor position information from Redis 114 and, if in auto-tune mode, will update the target position (corresponding to the target impedance) according to the selected auto-tune algorithm. As previously outlined, this algorithm is customizable by the user and can be updated on the fly if required. This update could be done through the Python development platform. That is, the slave device 106 can receive python algorithms 116 to update the auto-tune algorithms. This is an advantageous feature which can enable rapid match unit prototyping. Python is an interpreted, object-oriented, high-level programming language with dynamic semantics. Its built-in data structures make it a very attractive tool for rapid application development. Python is a convenient scripting language often used to connect existing components together. The Python interpreter with its extensive library is available without charge for all major platforms, and can be freely distributed. Other scripting platforms could be used as an alternative to Python.

Many advanced plasma processes are driven by pulsed RF power, which provides access to plasma chemistries that are inaccessible to those driven by continuous wave RF power. Some processes can last for an hour, or more, with multiple, consecutive processing steps. These steps can proceed from one to the next without rest-breaks in between. Each step is carefully designed to incrementally advance the features being processed, towards completion. Therefore, each step involves some change in process conditions. The pulsed power schemes can be complex, with multi-level pulsing providing better feature control. A change in pulse profile may involve a change in the number of pulse levels and/or the duration of each level. The overall pulse profile repetition frequency may also be changed. The match controller and matching network is expected to function optimally throughout the various steps to ensure that maximum power delivery to the process is achieved consistently. For the type of pulsed RF power schemes already discussed, this will almost certainly require a different match tuning algorithm at each process step.

With the move towards smart manufacturing, it may not be guaranteed that the processing steps occur in the same order, every time, where a wider variety of products will be expected to flow through production lines in the future. For these reasons, the known paradigm of fixing the matching unit tuning algorithms before installing on the processing tool needs to be re-evaluated. A shift to a new paradigm, where the processing machine's master controller can give instructions to a smart matching network, in real-time, to control the tuning algorithms is highly desirable.

The matching network architecture illustrated in FIG. 1 is designed to enable all match hardware data to be exposed to the factory EtherCat network. The match controller can be installed locally in the matching box, as illustrated, or could reside fully in the plasma tool master controller. The controller accessibility, enabled by the network connectivity, allows tuning algorithms to be changed on the fly by the plasma tool master controller using the file over EtherCat (FoE), or alternative protocols. As previously mentioned, this involves match controller receiving an algorithm via the network while performing any of receiving and processing the impedance data and adjusting the capacitances. The received algorithm can be stored and used for the next step of the same plasma process, a later step of the same process or any step of a different plasma process. This is essential for multi-step processes where tuning algorithms can be changed at high speed, seamlessly, as the process steps transition from one to the next. In the case where the order of the steps may change from time to time, the plasma tool master can select from a library of algorithms and update the match controller in real time.

Other inputs to the controller include the EtherCat address selection, interlock switches, internal temperature sensors and DC voltage sensors. Outputs from the controller will include the status LEDs, RUN and ERR LEDs for the external Ethercat network. These inputs interface with an application 117 running on the CPU 108 of the controller 100 and data is stored in Redis memory.

Access to the controller is also available over USB and/or RS232 118. A user interface on a PC can be used to configure the match controller when it is not on the EtherCat network. This is important for offline testing and calibration when the controller (or matching network/unit having the controller therein) is not attached to the plasma processing tool/system. It will be appreciated that other interfaces or ports may be used other than USB and RS232.

A typical (prior art) auto-tuning matching network would have pre-sets configured for the capacitor positions. These would be established at the process development phase. Capacitor positions (or values) would be established for a standard process run and stored in memory. Process drift, component degradation through ageing and thermally induced drift due to power dissipated in match unit components cause the optimum capacitor positions to change. The fine tuning algorithm monitors drift in the power delivery and tunes the capacitor positions to compensate. With the apparatus described herein, preset positions are not essential. A high resolution map of the impedance matching range can be stored in the Redis memory location. The output sensor (VI probe) measures the process impedance accurately. As a coarse tuning step, the algorithm finds the conjugate or corresponding impedance on the map and instructs the capacitors to go directly to this impedance position. A fine tuning step is then applied to tweak the capacitor positions to maximise the power delivery as reported by the input sensor. This methodology enables fast tuning of the match unit when there is a change in the process impedance.

The following key features of the invention described herein should be noted:
  Local controller can run at speeds independent to the factory master
  Can run local intelligent algorithms
  Provides for lower data latency at the network edge
  Allows for customizable control algorithms, which can be updated on the fly
  Simultaneous master and slave operation of the controller
  Control system is scalable, allows multiple sensors/caps to be integrated seamlessly
  Can be a Linux-based Ethercat master/save station control system and method It should also be noted that typically, communications inside the matching networks, between various hardware elements including sensors and motors is ad-hoc. Sensors may use a local interface such as SPI or UART. Motors may be controlled with voltage level and/or speed controlled or stepped with TTL signals or a local controller using UART/RS485. Using a standardized industrial networking protocol means parts such as motors and sensors are interchangeable, allowing manufacturers to vertically integrate the match unit into their tool.

As will be clear to the person skilled in the art, an EtherCat network generally has a single master and multiple slave devices. The present teachings create a local master controller that behaves like a slave device when communicating with a higher level master on the network. The controller, therefore, operates as a master and slave, simultaneously. This enables the control architecture illustrated in FIG. 2, extending the well-known master/slave architecture to a new master/slave-master/slave architecture.

Another novel implementation of the match unit control architecture is to integrate the controller 100 module into the plasma tool master controller to create a fully remote-controlled matching network. Thus creating the first local-controllerless matching unit. As discussed earner, the only downside is that the speed is limited by the factory network speed. As network speeds and reliability improves, particularly with the rollout of 5G for the smart factories of the future, the fully remote control of the matching network will be more appealing.

The apparatus provided for in the current teachings comprises a matching unit controller working in combination with one or more RF input sensors and one or more RF output sensors. The controller has an EtherCat Master controller application and acts as a local EtherCAT Master in the matching unit. The controller gathers data from the input and output sensors and feeds the data to an intelligent algorithm. The output from the algorithm is used to set the matching unit capacitor positions. The controller also has an EtherCAT slave controller application to communicate with the plasma processing machine's master controller.

Described herein is a controller that allows a user to have complete control over how the match unit performs. A user can buy a metal box, add off the shelf variable capacitors, inductors, sensors etc. along with match unit controller (and sensors) described herein and easily customise a match unit to their own specifications. They can even add smart algorithms. This enables rapid prototyping and faster process development.

Using a stepper-motor, the capacitance of the variable capacitor can be tuned precisely.

The words comprises/comprising when used in this specification are to specify the presence of stated features, integers, steps or components but does not preclude the presence or addition of one or more other features, integers, steps, components or groups thereof.

The invention claimed is:

1. A controller for a matching unit of a plasma processing system, the controller configured to:
    receive impedance data as viewed from an RF generator side of the system from the matching unit;
    receive impedance data with respect to a chamber of the system from the matching unit;
    process the impedance data using an algorithm to determine a target impedance of the matching unit to match the impedance of the chamber to the impedance of the RF generator;
    adjust the capacitances of variable capacitors of the matching unit to achieve the target impedance by causing a change in a motor position associated with a variable capacitor;
wherein the controller is further configured to simultaneously;
    act as a master controller for the matching unit when communicating with the matching unit, and
    act as an slave controller for the matching unit when communicating with a master controller of the plasma processing system.

2. The controller of claim 1 wherein the controller is further configured to communicate with the matching unit and the master controller of the plasma processing system across a network based on at least one network protocol.

3. The controller of claim 2 wherein the controller is further configured to receive an algorithm via the network while performing any of the receiving and processing the impedance data and adjusting the capacitances, and store the received algorithm for later use.

4. The controller of claim 3 wherein the receiving and processing of the impedance data and adjusting the capacitances are performed for each step of a multiple step plasma process and the controller is configured to receive an algorithm during each step of the plasma process and use the received algorithm for a subsequent step of the plasma process.

5. The controller of claim 3 wherein the controller is further configured to receive an algorithm, while acting as the slave controller of the matching unit, from a master controller of the plasma processing system, and while simultaneously acting as the master controller for the matching unit.

6. The controller of claim 1 wherein the controller is further configured to store a high resolution map of an impedance matching range, wherein the map is used to find the target impedance based on the impedance data from the output sensor.

7. The controller of claim 6 wherein the controller is further configured to process the impedance data with respect to the chamber of the system, use the algorithm to find a conjugate impedance on the high resolution map and adjust the capacitances of the variable capacitors to achieve the conjugate impedance.

8. The controller of claim 7 wherein the controller is further configured to apply a fine tuning step after the capacitors have been adjusted to achieve the conjugate impedance, the fine tuning step further adjusting the capacitances of the capacitors to maximise power delivery.

9. The controller of claim 1 wherein the impedance data with respect to an RF generator of the system is received from an input sensor of the matching unit.

10. The controller of claim 9 wherein the input sensor monitors the magnitude of the RF voltage and current, their harmonics and the phase shift between them.

11. The controller of claim 1 wherein the impedance data with respect to a chamber of the system is received from an output sensor of the matching unit.

12. The controller of claim 11 wherein the output sensor monitors the magnitude of the RF voltage and current, their harmonics and the phase shift between them.

13. The controller of claim 1 wherein the controller is further configured to interface with a computer via a communication port distinct from an interface used to communicate with the plasma processing system.

14. The controller of claim 13 wherein the controller is further configured to receive an algorithm via the interface, store the received algorithm and use the algorithm to determine the target impedance.

15. A matching unit comprising the controller of claim 1.

* * * * *